(12) United States Patent
Huang et al.

(10) Patent No.: US 11,329,261 B2
(45) Date of Patent: May 10, 2022

(54) ORGANIC LIGHT EMITTING DIODE SUBSTRATE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Fengying Huang, Hubei (CN); Weijie Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 162 days.

(21) Appl. No.: 16/609,216

(22) PCT Filed: Aug. 23, 2018

(86) PCT No.: PCT/CN2018/101928
§ 371 (c)(1),
(2) Date: Oct. 29, 2019

(87) PCT Pub. No.: WO2019/237506
PCT Pub. Date: Dec. 19, 2019

(65) Prior Publication Data
US 2020/0212342 A1 Jul. 2, 2020

(30) Foreign Application Priority Data

Jun. 12, 2018 (CN) .......................... 201810598656.6

(51) Int. Cl.
H01L 51/52 (2006.01)
H01L 51/00 (2006.01)
H01L 51/56 (2006.01)

(52) U.S. Cl.
CPC ........ *H01L 51/529* (2013.01); *H01L 51/0097* (2013.01); *H01L 51/5246* (2013.01); *H01L 51/56* (2013.01); *H01L 2251/5338* (2013.01)

(58) Field of Classification Search
CPC ............... H01L 51/529; H01L 51/0097; H01L 51/5246
See application file for complete search history.

(56) References Cited

U.S. PATENT DOCUMENTS

2017/0194595 A1* 7/2017 Li ..................... H01L 51/0003
2019/0123289 A1 4/2019 Yu

FOREIGN PATENT DOCUMENTS

CN 104505467 A 4/2015
CN 106129088 A 11/2016
(Continued)

*Primary Examiner* — Anthony Ho
(74) *Attorney, Agent, or Firm* — Mark M. Friedman (57) ABSTRACT

An organic light emitting diode substrate and methods of operating the same are provided and include a flexible substrate, a heat dissipation layer, and an adhesive layer, wherein the adhesive layer is configured to provide adhesion between the flexible substrate and the heat dissipation layer, the heat dissipation layer comprises a first sub heat dissipation layer and a second sub heat dissipation layer, and the first sub heat dissipation layer and the second sub heat dissipation layer are alternately stacked and the first sub heat dissipation layer is made of a metal material and the second sub heat dissipation layer is made of at least one of an organic material and an inorganic material.

11 Claims, 7 Drawing Sheets

(56) References Cited

FOREIGN PATENT DOCUMENTS

| | | |
|---|---|---|
| CN | 106356472 A | 1/2017 |
| CN | 107845740 A | 3/2018 |
| JP | 2018006377 A | 1/2018 |

* cited by examiner

ORGANIC LIGHT EMITTING DIODE SUBSTRATE AND MANUFACTURING METHOD THEREOF

FIELD OF INVENTION

The invention relates to the field of display panel manufacturing technologies, and in particular to an organic light emitting diode substrate and a manufacturing method thereof.

BACKGROUND OF INVENTION

Organic light emitting diode (OLED) display technologies differ from traditional liquid crystal display (LCD) display technologies in that organic light emitting diode display technologies do not require backlights and they possess self-luminous characteristics and employ extremely thin coatings of organic materials and glass substrates. These organic materials emit light when current pass thought them. In addition, displays can be made lighter and thinner, and they possess greater visual angles and save significantly energy.

Generally, substrates, which are used for forming flexible OLED devices, are mainly polyethylene terephthalate (PET), polyethylene naphthalate (PEN), or polyimide (PI). However, these types of flexible substrates are generally not resistant to high temperatures and have high surface roughness so structures and features of the flexible substrates are destroyed by several reasons, such as high-temperature baking, when undergoing subsequent manufacturing processes of the organic light emitting diodes. In addition, the manufacturing processes of the flexible substrates are that the flexible substrates are baked and shaped by an oven after flexible substrate solution is coated using a coating machine. However, the temperature is too high so the flexible substrates are likely to be burnt and the flexible substrates are required to be monitored constantly, which wastes a lot of manufacturing process time of the flexible substrate. Therefore, there is a need for an organic light emitting diode substrate and a manufacturing method thereof to solve the problem.

SUMMARY OF INVENTION

The present disclosure provides an organic light emitting diode substrate and a manufacturing method to solve the problem that organic light emitting diode substrates are prone to damage during manufacturing processes of the existing organic light emitting diode substrates because the high-temperature resistance property of the flexible substrates is poor which prolongs baking time of the flexible substrates in an oven.

In order to achieve the foregoing purposes, technical schemes provided by the disclosure are as follows:

According to one aspect of the present invention, there is provided a substrate of an organic light emitting diode, comprising: a flexible substrate, a heat dissipation layer, and an adhesive layer configured to provide adhesion between the flexible substrate and the heat dissipation layer, and the adhesive layer is disposed between the flexible substrate and the heat dissipation layer;

wherein the flexible substrate is disposed on one side or both sides of the heat dissipation layer;

wherein the heat dissipation layer comprises a first sub heat dissipation layer and a second sub heat dissipation layer, and the first sub heat dissipation layer and the second sub heat dissipation layer are alternately stacked; and wherein the first sub heat dissipation layer is made of a metal material, and the second sub heat dissipation layer is made of at least one of an organic material and an inorganic material.

According to a preferred embodiment of the present invention, the first sub heat dissipation layer is a curved structure.

According to a preferred embodiment of the present invention, the first sub heat dissipation layer comprises at least one reinforced heat dissipation layer, and a projection of the reinforced heat dissipation layer on a horizontal plane, where the flexible substrate is disposed, completely covers the flexible substrate; the reinforced heat dissipation layer comprises a first section and a second section; the first section is an overlapping section in which the projection of the reinforced heat dissipation layer on the horizontal plane where the flexible substrate is disposed overlaps the flexible substrate, and the second section is an non-overlapping section in which the projection of the reinforced heat dissipation layer on the horizontal plane where the flexible substrate is disposed does not overlap the flexible substrate.

According to a preferred embodiment of the present invention, the second section surrounds the first section.

According to another aspect of the invention, there is provided a manufacturing method of a substrate of an organic light emitting diode, comprising steps of:

a step S10 of providing a rigid substrate, coating a first adhesive layer on the rigid substrate, forming a heat dissipation layer on the first adhesive layer, wherein the heat dissipation layer comprises a first sub heat dissipation layer and a second sub heat dissipation layer which are alternately stacked and the first adhesive layer is configured to provide adhesion between the rigid substrate and the heat dissipation layer;

a step S20 of forming a second adhesive layer on the heat dissipation layer, coating a flexible substrate solution on the second adhesive layer, and curing the flexible substrate solution by applying a heating process to form a flexible substrate, wherein the second adhesive layer is configured to provide adhesion between the flexible substrate and the heat dissipation layer;

a step S30 of forming a first metal and other organic light emitting display devices on the flexible substrate; and a step S40 of stripping the rigid substrate;

wherein the first sub heat dissipation layer is form of a metal material and the second sub heat dissipation layer is form of at least one of an organic material and an inorganic material.

According to a preferred embodiment of the present invention, the first sub heat dissipation layer is a curved structure, the first sub heat dissipation layer comprises at least one reinforced heat dissipation layer, and a projection of the reinforced heat dissipation layer on a horizontal plane, where the flexible substrate is disposed, completely covers the flexible substrate; the reinforced heat dissipation layer comprises a first section and a second section; the first section is an overlapping section in which the projection of the reinforced heat dissipation layer on the horizontal plane where the flexible substrate is disposed overlaps the flexible substrate, and the second section is an non-overlapping section in which the projection of the reinforced heat dissipation layer on the horizontal plane where the flexible substrate is disposed does not overlap the flexible substrate.

The step S30 specifically comprises the steps of: forming a buffer layer, a polycrystalline silicon layer, and a gate insulating layer on the flexible substrate in sequence, coating a first metal layer on the gate insulating layer, and etching the first metal layer and the reinforced heat dissipation layer by applying a masking process, wherein the first metal layer forms a first metal, a second section of the reinforced heat dissipation layer is etched and removed, and the first metal is a gate metal.

According to another aspect of the present invention, there is provided a manufacturing method of a substrate of an organic light emitting diode, comprising steps of:

a step S10 of providing a rigid substrate, forming a first flexible substrate on the rigid substrate, coating a first adhesive layer on the rigid substrate sequentially, forming a heat dissipation layer on the first adhesive layer, wherein the heat dissipation layer comprises a first sub heat dissipation layer and a second sub heat dissipation layer which are alternately stacked and the first adhesive layer is configured to provide adhesion between the first flexible substrate and the heat dissipation layer;

a step S20 of forming a second adhesive layer on the heat dissipation layer, coating a flexible substrate solution on the second adhesive layer, and curing the flexible substrate solution by applying a heating process to form a second flexible substrate, wherein the second adhesive layer is configured to provide adhesion between the second flexible substrate and the heat dissipation layer;

a step S30 of forming a first metal and other organic light emitting display devices on the second flexible substrate; and a step S40 of stripping the rigid substrate;

wherein the first sub heat dissipation layer is form of a metal material and the second sub heat dissipation layer is form of at least one of an organic material and an inorganic material.

According to a preferred embodiment of the present invention, the first sub heat dissipation layer is a curved structure, the first sub heat dissipation layer comprises at least one reinforced heat dissipation layer, and a projection of the reinforced heat dissipation layer on a horizontal plane, where the first flexible substrate is disposed, completely covers the first flexible substrate; the reinforcing heat dissipation layer comprises a first section and a second section; the first section is an overlapping section in which the projection of the reinforcing heat dissipation layer on the horizontal plane where the first flexible substrate is disposed overlaps the first flexible substrate, and the second section is an non-overlapping section in which the projection of the reinforcing heat dissipation layer on the horizontal plane where the first flexible substrate is disposed does not overlap the first flexible substrate.

The step S30 comprises the steps of: forming a buffer layer, a polycrystalline silicon layer, and a gate insulating layer on the second flexible substrate in sequence, coating a first metal layer on the gate insulating layer, and etching the first metal layer and the reinforced heat dissipation layer by applying a masking process, wherein the first metal layer forms a first metal, a second section of the reinforced heat dissipation layer is etched and removed, and the first metal is a gate metal.

According to a preferred embodiment of the present invention, the second section surrounds the first section.

According to another aspect of the present invention, there is provided a substrate of an organic light emitting diode comprising, a flexible substrate, a heat dissipation layer, and an adhesive layer, wherein the adhesive layer is configured to provide adhesion between the flexible substrate and the heat dissipation layer, and the adhesive layer is disposed between the flexible substrate and the heat dissipation layer;

wherein the flexible substrate is disposed on one side or both sides of the heat dissipation layer and the flexible substrate is a polyimide substrate;

wherein the heat dissipation layer comprises a first sub heat dissipation layer and a second sub heat dissipation layer, and the first sub heat dissipation layer and the second sub heat dissipation layer are alternately stacked; and wherein the first sub heat dissipation layer is made of a metal material, and the second sub heat dissipation layer is made of at least one of an organic material and an inorganic material.

According to a preferred embodiment of the present invention, the first sub heat dissipation layer is a curved structure.

According to a preferred embodiment of the present invention, the first sub heat dissipation layer comprises at least one reinforced heat dissipation layer, and a projection of the reinforced heat dissipation layer on a horizontal plane, where the flexible substrate is disposed, completely covers the flexible substrate; the reinforced heat dissipation layer comprises a first section and a second section; the first section is an overlapping section in which the projection of the reinforced heat dissipation layer on the horizontal plane where the flexible substrate is disposed overlaps the flexible substrate, and the second section is an non-overlapping section in which the projection of the reinforced heat dissipation layer on the horizontal plane where the flexible substrate is disposed does not overlap the flexible substrate.

According to a preferred embodiment of the present invention, the second section surrounds the first section.

Advantages of the present disclosure is that the present disclosure provides an organic light emitting diode substrate and a manufacturing method thereof. By disposing a heat dissipation layer on the flexible substrate, the high-temperature resistance property of the flexible substrate is effectively improved, the baking time of the flexible substrate solution in the oven is shortened, the preparation time of the flexible substrate is shortened and the production efficiency is improved by a special structure of the heat dissipation layer.

DESCRIPTION OF DRAWINGS

In order to illustrate a technical solution in the embodiments or in the prior art more clearly, the accompanying drawings required in the description of the embodiments or the prior art are introduced briefly hereafter. It is obvious that the accompanying drawings in the following description are merely part of the embodiments of the present invention. People with ordinary skills in the art can obtain other drawings without making inventive efforts.

DETAILED DESCRIPTION OF PREFERRED EMBODIMENTS

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

In view of the existing organic light emitting diode substrate that is prone to damage during the manufacturing process of the existing organic light emitting diode substrate because the high-temperature resistance property of the flexible substrates is poor which prolongs baking time of the flexible substrates in an oven. The present disclosure provides an organic light emitting diode substrate and a manufacturing method thereof which can ameliorate that deficiency.

The present disclosure will be further described in detail with the accompanying drawings and the specific embodiments.

Figure 1:
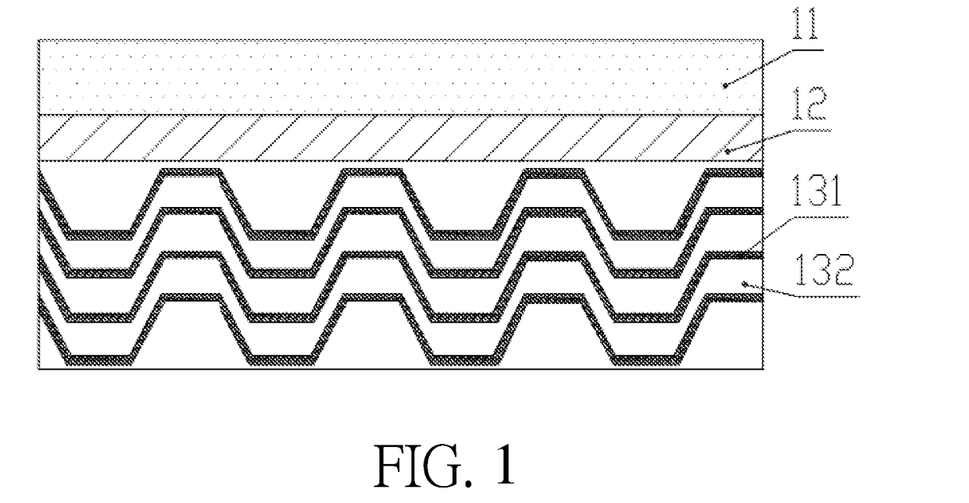
FIG. 1 is a structural schematic view of an organic light emitting diode substrate according to an embodiment of the present invention.
Figure 2:
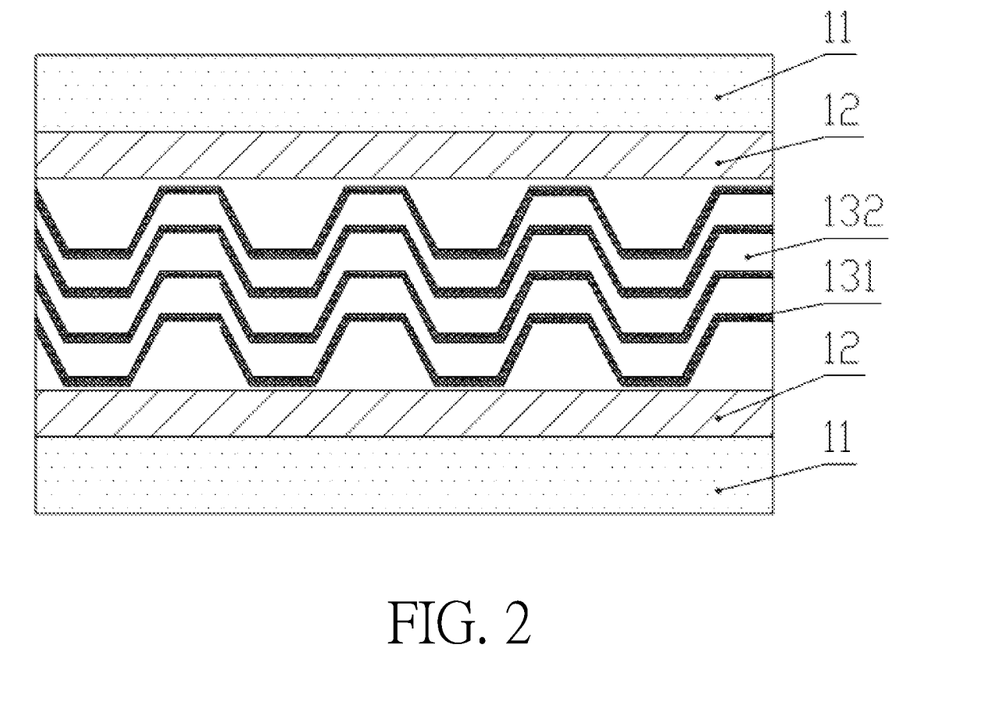
FIG. 2 is a structural schematic view of a substrate of another organic light emitting diode according to an embodiment of the present invention.
Figure 3:
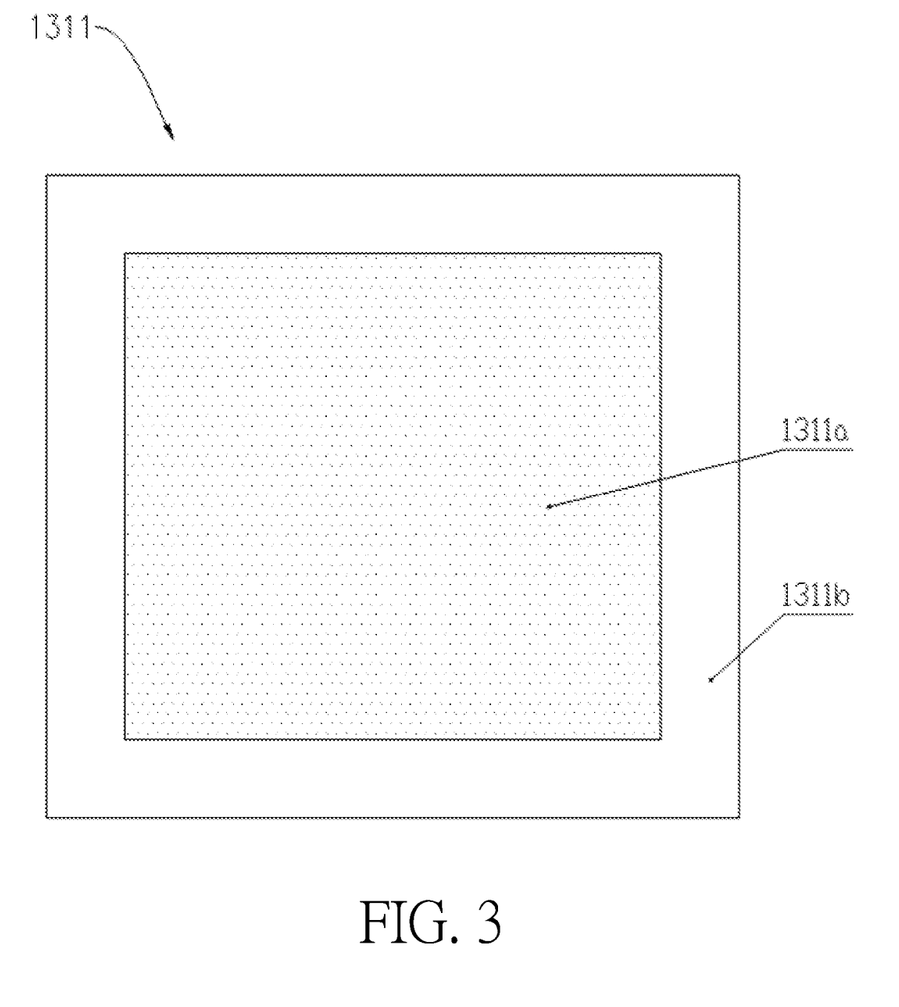
FIG. 3 is a structural schematic view of a reinforced heat dissipation layer according to an embodiment of the present invention.
Figure 4:
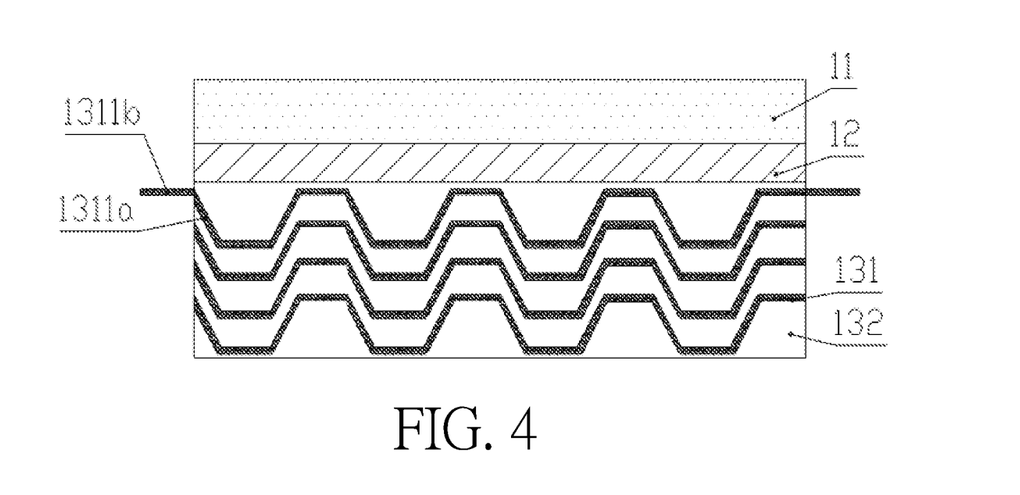
FIG. 4 is a structural schematic view of a reinforced heat dissipation layer on an organic light emitting diode substrate according to an embodiment of the present invention.
Figure 5A:
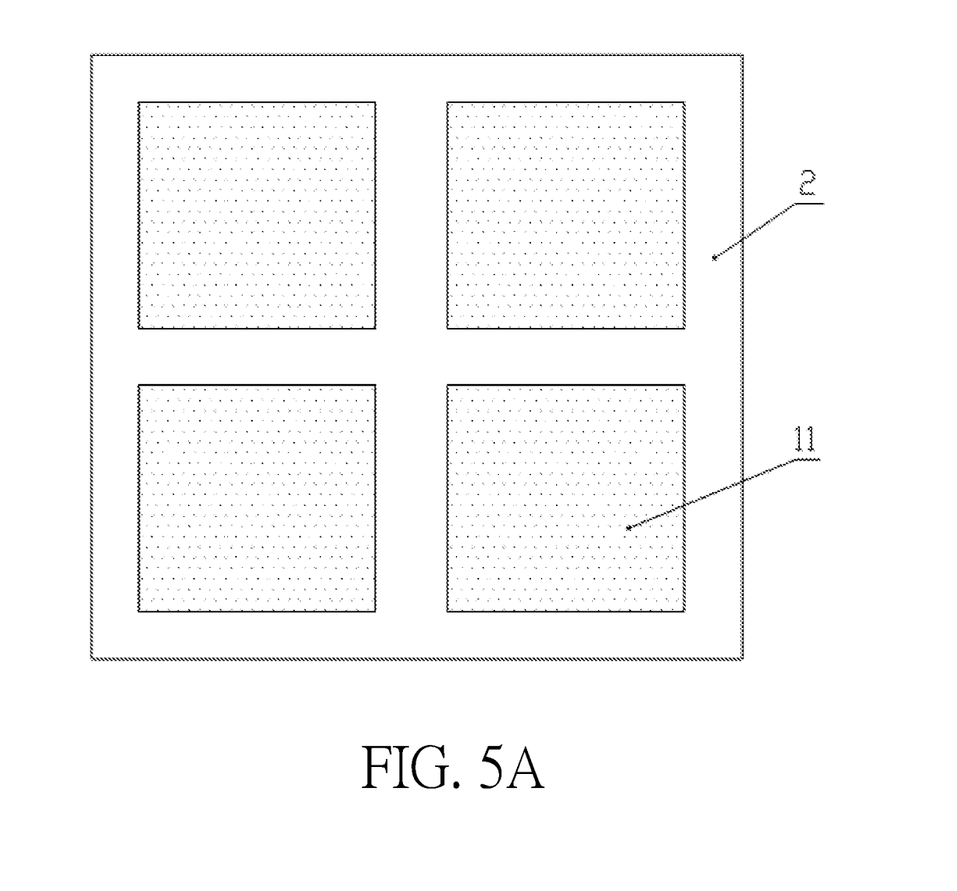
FIGS. 5A-5C are structural schematic views of distribution of a flexible substrate on the rigid substrate according to an embodiment of the present invention.
Figure 5B:
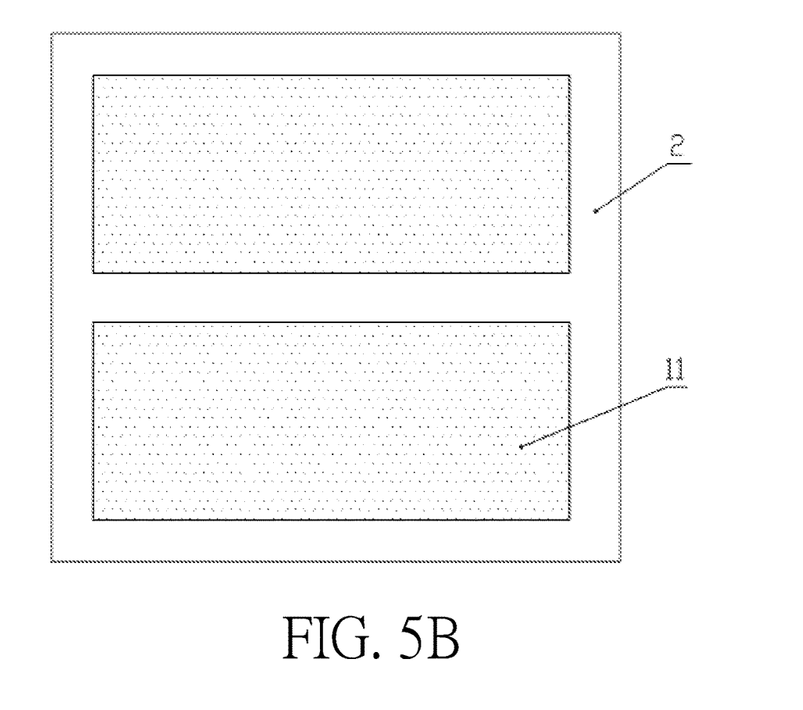
Figure 5C:
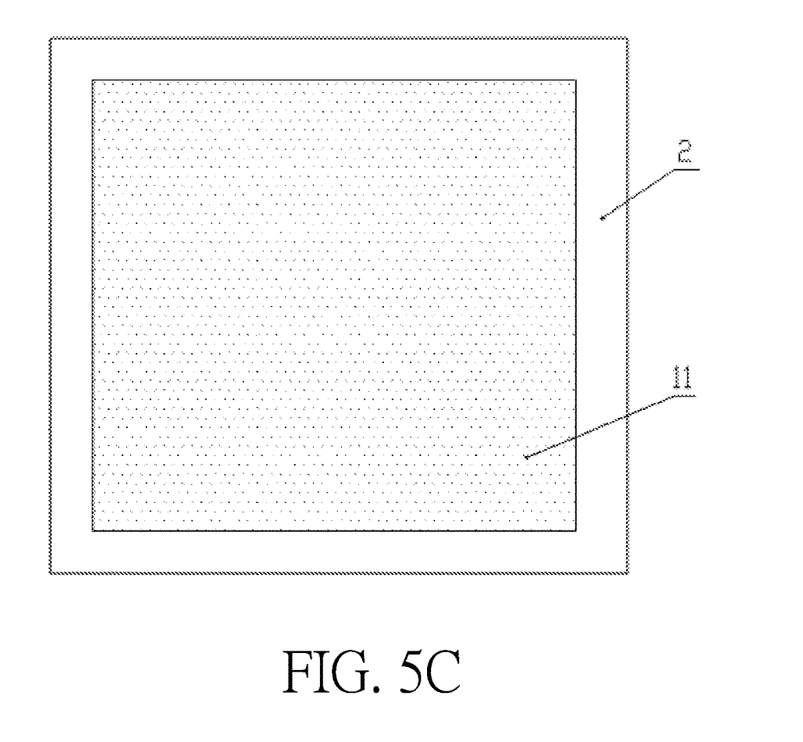

FIG. 1 is a structural schematic view of an organic light emitting diode substrate according to an embodiment of the present invention. FIG. 2 is a structural schematic view of another substrate of another organic light emitting diode according to an embodiment of the present invention. FIG. 3 is a structural schematic view of a reinforced heat dissipation layer according to an embodiment of the present invention. FIG. 4 is a structural schematic view of a reinforced heat dissipation layer on an organic light emitting diode substrate according to an embodiment of the present invention.

As shown in FIG. 1 and FIG. 2, the present disclosure provides an organic light emitting diode substrate 1 in embodiment I. The organic light emitting diode substrate 1 comprising, a flexible substrate 11, a heat dissipation layer 13, and an adhesive layer 12 configured to provide adhesion between the flexible substrate and the heat dissipation layer, and the adhesive layer 12 is disposed between the flexible substrate 11 and the heat dissipation layer 13.

The flexible substrate 11 is disposed on one side or both sides of the heat dissipation layer 13.

The heat dissipation layer 13 comprises a first sub heat dissipation layer 131 and a second sub heat dissipation layer 132, and the first sub heat dissipation layer 131 and the second sub heat dissipation layer 132 are alternately stacked.

The first sub heat dissipation layer 131 is made of a metal material, and the second sub heat dissipation layer 132 is made of at least one of an organic material and an inorganic material.

Furthermore, by disposing a heat dissipation layer at the position of the flexible substrate 11, the heat resistance of the flexible substrate can be enhanced when curing and other subsequent processes of organic light emitting diodes, and the baking time of the flexible substrate solution in the oven is shortened, thereby the flexible substrate is protected from being damaged and the processing time is saved.

The heat dissipation layer 13 is a structure comprising a first sub heat dissipation layer 131 and a second sub heat dissipation layer 132, the first sub heat dissipation layer 131 and the second sub heat dissipation layer 132 are alternately stacked. The first sub heat-dissipation layer 131 is made of a metal material. It is noted that the metal material herein is mainly are metal materials with good thermal conductivity and good stability. For example, silver, copper, and aluminum. The manufacturing material of the second sub heat dissipation layer 132 is one of inorganic materials and organic materials. The second sub heat dissipation layer 132 possesses two functions: 1. Blocking particles of pollutants from outside. 2. Planarizing the first sub heat dissipation layer 131 which is a primary heat dissipation body of the heat dissipation layer.

Commonly used flexible substrates are generally divided into single-layer flexible substrates and double-layer flexible substrates. The present disclosure describes the single-layer flexible substrates and the double-layer flexible substrates separately in order to differentiate them from each other.

Furthermore, in order to enhance the heat dissipation capability of the heat dissipation layer 13, the first sub heat dissipation layer 131 is disposed as a curved structure. As shown in FIG. 1 is a single-layer flexible substrate structure of an organic light emitting diode substrate. As shown in FIG. 2 is a double-layer flexible substrate structure of an organic light emitting diode substrate.

The substrates of double-layer flexible substrate structure are flexible substrates 11 which is disposed on both sides of the heat dissipation layer 13 and the substrate of the single-layer flexible substrate structure is a flexible substrate 11 which is disposed on one side of the heat dissipation layer 13.

Preferably, the flexible substrate is a polyimide substrate.

Preferably, as shown in FIG. 3, the first sub heat dissipation layer 131 comprises at least one reinforced heat dissipation layer 1311, and a projection of the reinforced heat dissipation layer 1311 on a horizontal plane, where the flexible substrate 11 is disposed, completely covers the flexible substrate 11; the reinforced heat dissipation layer 1311 comprises a first section 1311a and a second section 1311b; the first section 1311a is an overlapping section in which the projection of the reinforced heat dissipation layer 1311 on the horizontal plane where the flexible substrate 11 is disposed overlaps the flexible substrate, and the second section is an non-overlapping section in which the projection of the reinforced heat dissipation layer on the horizontal plane where the flexible substrate is disposed does not overlap the flexible substrate.

Specifically, FIG. 4 is a structural schematic view of a reinforced heat dissipation layer on an organic light emitting diode substrate 1311. A pattern of the second section 1311b can be specifically disposed according to actual conditions, which is not limited herein. The heat of the flexible substrate is efficiently directed to an external environment, thereby a temperature of the flexible substrate can be reduced.

Preferably, as shown in FIG. 3, the second section 1311b surrounds the first section 1311a. Owing to the structure which the first section 1311a is surrounded by the second section 1311b, the heat at the position of the flexible substrate can be dissipated more quickly.

Figure 6:
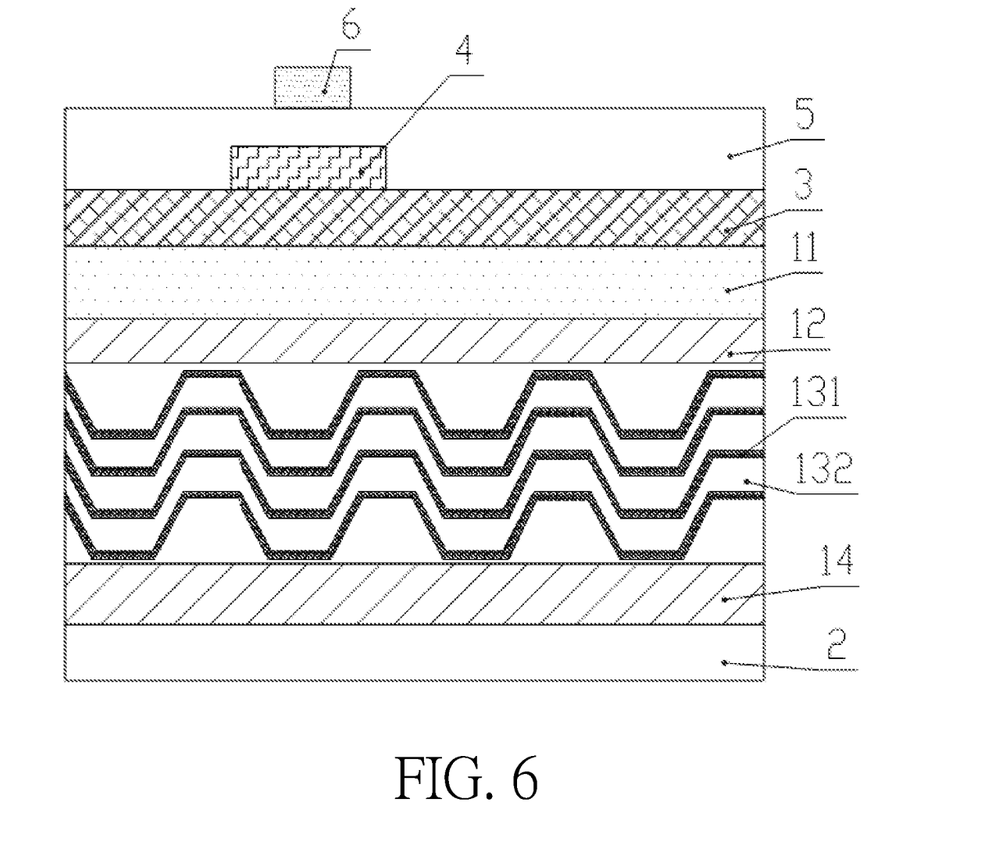
FIG. 6 is a structural schematic view of an organic light emitting diode substrate in a step S30 according to an embodiment of the present invention.
Figure 7:
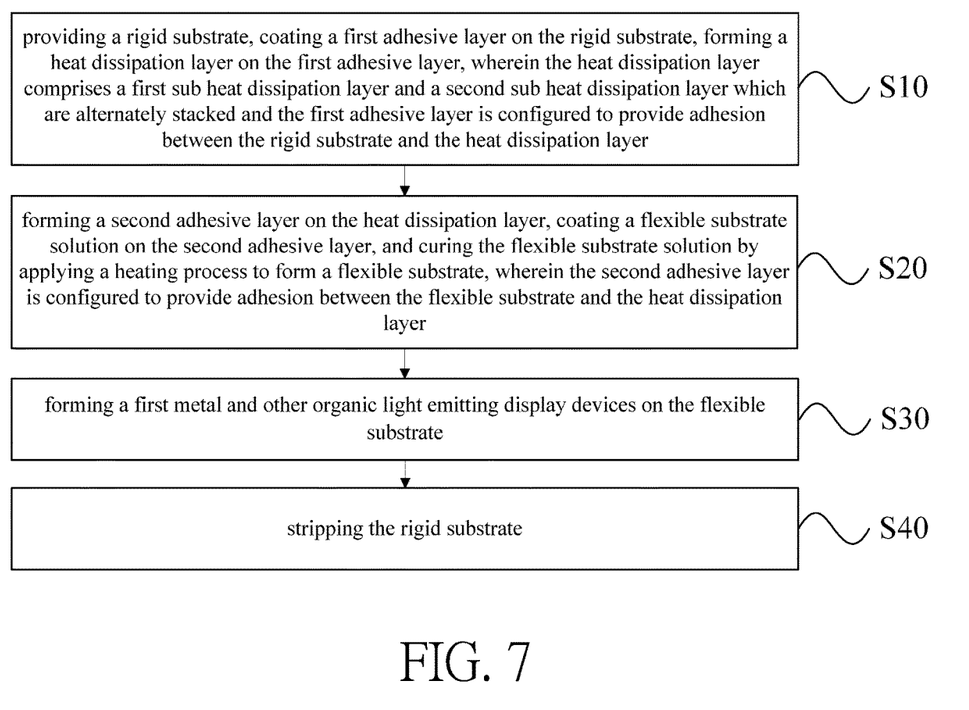
FIG. 7 is a schematic flow diagram of a manufacturing method of an organic light emitting diode substrate according to an embodiment of the present invention.

As shown in FIG. 6 and FIG. 7, embodiment II is provided according to another aspect of the present invention. Embodiment II is a manufacturing method of an organic light emitting diode substrate, comprising steps of:

A step S10 of providing a rigid substrate 2, coating a first adhesive layer 14 on the rigid substrate, forming a heat dissipation layer 13 on the first adhesive layer 14, wherein the heat dissipation layer 13 comprises a first sub heat dissipation layer 131 and a second sub heat dissipation layer 132 which are alternately stacked and the first adhesive layer 14 is configured to provide adhesion between the rigid substrate 2 and the heat dissipation layer 13.

A step S20 of forming a second adhesive layer 12 on the heat dissipation layer 13, coating a flexible substrate solution on the second adhesive layer 12, and curing the flexible substrate solution by applying a heating process to form a flexible substrate 11, wherein the second adhesive layer is configured to provide adhesion between the flexible substrate and the heat dissipation layer.

Specifically, in the curing process of the flexible substrate solution, the coated flexible substrate solution is required to be baked in an oven. The heat dissipation layer added in the present disclosure can ensure the temperature of the flexible substrate is not too high to damage the flexible substrate structure. Therefore, no complicated process is required to prevent coking of the flexible substrate, which further shortens the manufacturing time of the flexible substrate.

A step S30 of forming a first metal 5 and other organic light emitting display devices on the flexible substrate 11.

Specifically, the step S30 further comprises the steps of: forming a buffer layer 3, a polycrystalline silicon layer 4, and a gate insulating layer 5 on the flexible substrate in sequence, coating a first metal layer on the gate insulating layer, and etching the first metal layer and the reinforced heat dissipation layer 1311 by applying a masking process, wherein the first metal layer forms a first metal 6, a second section 1311b of the reinforced heat dissipation layer 1311 is etched and removed, and the first metal 6 is a gate metal.

A step s40 of stripping the rigid substrate 2.

The first sub heat dissipation layer 131 is form of a metal material and the second sub heat dissipation layer 132 is form of at least one of an organic material and an inorganic material.

Preferably, the first sub heat dissipation layer 131 is a curved structure, the first sub heat dissipation layer 131 comprises at least one reinforced heat dissipation layer 1311, and a projection of the reinforced heat dissipation layer 1311 on a horizontal plane, where the flexible substrate 11 is disposed, completely covers the flexible substrate 11; the reinforced heat dissipation layer 1311 comprises a first section 1311a and a second section 1311b; the first section 1311a is an overlapping section in which the projection of the reinforced heat dissipation layer 1311 on the horizontal plane where the flexible substrate 11 is disposed overlaps the flexible substrate 11, and the second section 1311b is an non-overlapping section in which the projection of the reinforced heat dissipation layer 1311 on the horizontal plane where the flexible substrate 11 is disposed does not overlap the flexible substrate 11.

Embodiment II is a manufacturing method of a substrate of a single-layer flexible substrate structure, the organic light emitting diode substrate formed by the present disclosure can be used in an organic light emitting diode display panel and a display device. Considering the structural arrangement of the second section of the reinforced heat dissipation layer might cause an electrostatic discharge protection problem in the subsequent processes, the second section is also etched while etching the gate metal layer to form a gate metal in the present disclosure. Not only achieve a heat dissipation demand for the flexible substrate in the manufacturing process, but also solve the subsequent electrostatic discharge protection problem without extra process.

Because the manufacturing method of a single-layer flexible substrate is described in embodiment II, the manufacturing method of the substrate of the double-layer flexible substrate is then described as follows.

Figure 8:
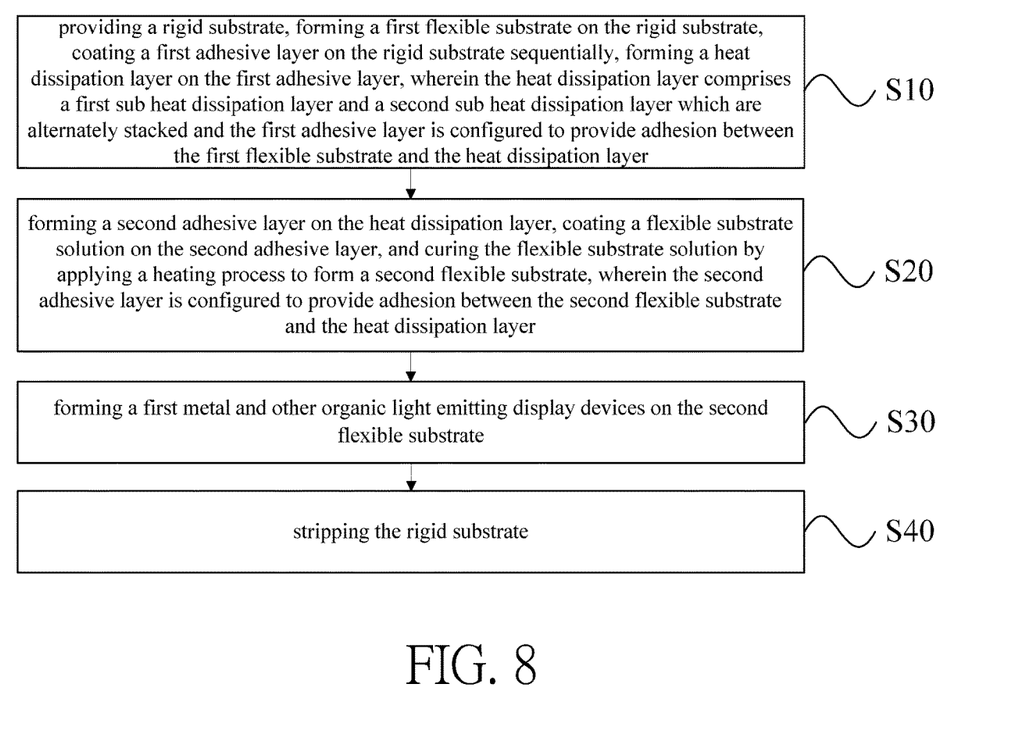
FIG. 8 is a schematic flow diagram of a manufacturing method of another organic light emitting diode substrate according to an embodiment of the present invention.

As shown in FIG. 8, embodiment III is provided according to another aspect of the present invention. Embodiment III is a manufacturing method of an organic light emitting diode substrate, comprising steps of:

A step S10 of providing a rigid substrate, forming a first flexible substrate on the rigid substrate, coating a first adhesive layer on the rigid substrate sequentially, forming a heat dissipation layer on the first adhesive layer, wherein the heat dissipation layer comprises a first sub heat dissipation layer and a second sub heat dissipation layer which are alternately stacked and the first adhesive layer is configured to provide adhesion between the first flexible substrate and the heat dissipation layer.

A step S20 of forming a second adhesive layer on the heat dissipation layer, coating a flexible substrate solution on the second adhesive layer, and curing the flexible substrate solution by applying a heating process to form a second flexible substrate, wherein the second adhesive layer is configured to provide adhesion between the second flexible substrate and the heat dissipation layer.

A step S30 of forming a first metal and other organic light emitting display devices on the second flexible substrate.

A step S40 of stripping the rigid substrate.

The first sub heat dissipation layer is form of a metal material and the second sub heat dissipation layer is form of at least one of an organic material and an inorganic material.

Preferably, the first sub heat dissipation layer is of a curved structure, wherein the first sub heat dissipation layer is a curved structure, the first sub heat dissipation layer comprises at least one reinforced heat dissipation layer, and a projection of the reinforced heat dissipation layer on a horizontal plane, where the first flexible substrate is disposed, completely covers the first flexible substrate; the reinforcing heat dissipation layer comprises a first section and a second section; the first section is an overlapping section in which the projection of the reinforcing heat dissipation layer on the horizontal plane where the first flexible substrate is disposed overlaps the first flexible substrate, and the second section is an non-overlapping section in which the projection of the reinforcing heat dissipation layer on the horizontal plane where the first flexible substrate is disposed does not overlap the flexible substrate.

The step S30 comprises the steps of: forming a buffer layer, a polycrystalline silicon layer, and a gate insulating layer on the second flexible substrate in sequence, coating a first metal layer on the gate insulating layer, and etching the first metal layer and the reinforced heat dissipation layer by applying a masking process, wherein the first metal layer forms a first metal, a second section of the reinforced heat dissipation layer is etched and removed, and the first metal is a gate metal.

Preferably, the second section surrounds the first section.

Because the working principle of a manufacturing method of the organic light emitting diode substrate is the same as the principle of the organic light emitting diode substrate, please refer to the principle of the organic light emitting diode substrate for the principle of manufacturing method of the organic light emitting diode substrate, and details are not described herein.

Advantages of the present disclosure is that the present disclosure provides an organic light emitting diode substrate and a manufacturing method thereof, a heat dissipation layer is disposed on the flexible substrate, so that the high-temperature resistance property of the flexible substrate is effectively improved through the special structure of the heat dissipation layer, and the baking time of the flexible substrate solution in the oven is reduced, the preparation time of the flexible substrate is shortened and the production efficiency is improved.

In summary, although the present invention has been described with preferred embodiments thereof, the above preferred embodiments is not used to limit the present invention. One of ordinarily skill in the art can carry out changes and modifications to the described embodiment without departing from the scope and the spirit of the invention that is intended to be limited only by the appended claims.

The invention claimed is:

1. An organic light emitting diode substrate, comprising: a flexible substrate, a heat dissipation layer, and an adhesive layer, wherein the adhesive layer is configured to provide adhesion between the flexible substrate and the heat dissipation layer, and the adhesive layer is disposed between the flexible substrate and the heat dissipation layer;

wherein the flexible substrate is disposed on one side or both sides of the heat dissipation layer;

wherein the heat dissipation layer comprises a first sub heat dissipation layer and a second sub heat dissipation layer, and the first sub heat dissipation layer and the second sub heat dissipation layer are alternately stacked; and wherein the first sub heat dissipation layer is made of a metal material, and the second sub heat dissipation layer is made of at least one of an organic material and an inorganic material.

2. The organic light emitting diode substrate according to claim 1, wherein the first sub heat dissipation layer is a curved structure.

3. The organic light emitting diode substrate according to claim 1, wherein the first sub heat dissipation layer comprises at least one reinforced heat dissipation layer, and a projection of the reinforced heat dissipation layer on a horizontal plane, where the flexible substrate is disposed, completely covers the flexible substrate; the reinforced heat dissipation layer comprises a first section and a second section; the first section is an overlapping section in which the projection of the reinforced heat dissipation layer on the horizontal plane where the flexible substrate is disposed overlaps the flexible substrate, and the second section is an non-overlapping section in which the projection of the reinforced heat dissipation layer on the horizontal plane where the flexible substrate is disposed does not overlap the flexible substrate.

4. The organic light emitting diode substrate according to claim 3, wherein the second section surrounds the first section.

5. A manufacturing method of an organic light emitting diode substrate, comprising steps of:

a step S10 of providing a rigid substrate, coating a first adhesive layer on the rigid substrate, forming a heat dissipation layer on the first adhesive layer, wherein the heat dissipation layer comprises a first sub heat dissipation layer and a second sub heat dissipation layer which are alternately stacked and the first adhesive layer is configured to provide adhesion between the rigid substrate and the heat dissipation layer;

a step S20 of forming a second adhesive layer on the heat dissipation layer, coating a flexible substrate solution on the second adhesive layer, and curing the flexible substrate solution by applying a heating process to form a flexible substrate, wherein the second adhesive layer is configured to provide adhesion between the flexible substrate and the heat dissipation layer;

a step S30 of forming a first metal and other organic light emitting display devices on the flexible substrate; and a step S40 of stripping the rigid substrate;

wherein the first sub heat dissipation layer is form of a metal material and the second sub heat dissipation layer is form of at least one of an organic material and an inorganic material.

6. A manufacturing method of an organic light emitting diode substrate according to claim 5, wherein the first sub heat dissipation layer is a curved structure, the first sub heat dissipation layer comprises at least one reinforced heat dissipation layer, and a projection of the reinforced heat dissipation layer on a horizontal plane, where the flexible substrate is disposed, completely covers the flexible substrate; the reinforced heat dissipation layer comprises a first section and a second section; the first section is an overlapping section in which the projection of the reinforced heat dissipation layer on the horizontal plane where the flexible substrate is disposed overlaps the flexible substrate, and the second section is an non-overlapping section in which the projection of the reinforced heat dissipation layer on the horizontal plane where the flexible substrate is disposed does not overlap the flexible substrate;

wherein the step S30 specifically comprises the steps of: forming a buffer layer, a polycrystalline silicon layer, and a gate insulating layer on the flexible substrate in sequence, coating a first metal layer on the gate insulating layer, and etching the first metal layer and the reinforced heat dissipation layer by applying a masking process, wherein the first metal layer forms a first metal, a second section of the reinforced heat dissipation layer is etched and removed, and the first metal is a gate metal.

7. The manufacturing method of the organic light emitting diode substrate according to claim 6, wherein the second section surrounds the first section.

8. An organic light emitting diode substrate comprising, a flexible substrate, a heat dissipation layer, and an adhesive layer, wherein the adhesive layer is configured to provide adhesion between the flexible substrate and the heat dissipation layer, and the adhesive layer is disposed between the flexible substrate and the heat dissipation layer;

wherein the flexible substrate is disposed on one side or both sides of the heat dissipation layer and the flexible substrate is a polyimide substrate;

wherein the heat dissipation layer comprises a first sub heat dissipation layer and a second sub heat dissipation layer, and the first sub heat dissipation layer and the second sub heat dissipation layer are alternately stacked; and wherein the first sub heat dissipation layer is made of a metal material, and the second sub heat dissipation layer is made of at least one of an organic material and an inorganic material.

9. The organic light emitting diode substrate according to claim 8, wherein the first sub heat dissipation layer is a curved structure.

10. The organic light emitting diode substrate according to claim 8, wherein the first sub heat dissipation layer comprises at least one reinforced heat dissipation layer, and a projection of the reinforced heat dissipation layer on a horizontal plane, where the flexible substrate is disposed, completely covers the flexible substrate; the reinforced heat dissipation layer comprises a first section and a second section; the first section is an overlapping section in which the projection of the reinforced heat dissipation layer on the horizontal plane where the flexible substrate is disposed overlaps the flexible substrate, and the second section is an non-overlapping section in which the projection of the reinforced heat dissipation layer on the horizontal plane where the flexible substrate is disposed does not overlap the flexible substrate.

11. The organic light emitting diode substrate according to claim 10, wherein the second section surrounds the first section.

* * * * *